United States Patent
Mou et al.

(10) Patent No.: US 10,601,414 B2
(45) Date of Patent: Mar. 24, 2020

(54) BIAS GENERATOR

(71) Applicant: Dialog Semiconductor B.V., s-Hertogenbosch (NL)

(72) Inventors: Zhi Mou, Gilbert, AZ (US); Mohammad Hanif, Chandler, AZ (US); Mahbub Reja, Chandler, AZ (US); Shobak Kythakyapuzha, Tempe, AZ (US)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/002,496

(22) Filed: Jun. 7, 2018

(65) Prior Publication Data
US 2019/0379372 A1 Dec. 12, 2019

(51) Int. Cl.
| G05F 1/10 | (2006.01) |
|---|---|
| G05F 3/02 | (2006.01) |
| H03K 17/14 | (2006.01) |
| H03K 3/011 | (2006.01) |

(52) U.S. Cl.
CPC ........... H03K 17/145 (2013.01); H03K 3/011 (2013.01)

(58) Field of Classification Search
CPC ...... H03F 1/302; H03F 2200/18; H03F 1/301; H03F 1/0261; H03F 1/30
USPC .......... 327/543, 512–513; 330/296; 323/313, 323/315, 316
See application file for complete search history.

(56) References Cited

U.S. PATENT DOCUMENTS

| 5,373,228 | A * | 12/1994 | Holle | ...................... G05F 3/262 |
| | | | | 323/315 |
| 6,169,456 | B1 * | 1/2001 | Pauls | ...................... G05F 3/262 |
| | | | | 323/315 |
| 7,088,187 | B1 * | 8/2006 | Jin | ....................... H03G 1/0029 |
| | | | | 330/296 |
| 7,208,998 | B2 * | 4/2007 | Abel | ...................... G05F 3/262 |
| | | | | 323/315 |

FOREIGN PATENT DOCUMENTS

DE 19903577 A1 * 8/2000 ............. G05F 3/262

\* cited by examiner

*Primary Examiner* — Anh Q Tra
(74) *Attorney, Agent, or Firm* — Saile Ackerman LLC; Stephen B. Ackerman

(57) ABSTRACT

A bias generator and a method for generating a bias voltage are presented. The bias generator is for use with an electronic circuit comprising a first switch coupled in series with a second switch. The bias generator is adapted to generate a reference voltage, a first bias voltage, and a second bias voltage. The second bias voltage is based on the reference voltage. After applying the first voltage to the first switch and the second voltage to the second switch, the bias generator controls a voltage across the first switch. The bias generator may be adapted to set a value of the reference voltage to control the voltage across the first switch. For instance, the reference voltage may be set to a fix value so that the voltage across the first switch is maintained at a constant value.

20 Claims, 4 Drawing Sheets

BIAS GENERATOR

TECHNICAL FIELD

The present disclosure relates to a bias generator. In particular the present disclosure relates to a bias generator and method for generating a bias voltage.

BACKGROUND

A bias generator refers to a generator providing a bias such as a bias voltage of a bias current. For instance, a bias voltage may be the voltage applied to an electronic component in order to switch this component on or off or controlling an amount of current passing through the electronic component. Depending on the nature of electronic component, the bias voltage may be positive or negative. For example, a bias voltage may be applied to a control terminal of a transistor, such a base or a gate terminal, causing the transistor to become conductive or controlling an amount of current passing through the transistor. The bias may be used to set a DC operating voltage of a transistor. In turn the transistor may amplify an AC input signal properly.

Bias generators may be used with different types of circuits such as signal amplifiers, operational amplifiers and voltage to current convertors. Conventional bias generators for use with single ended low noise amplifier, (LNA) include a first stage for providing a first bias voltage and a second stage for providing a second bias voltage. The amplifier is formed by two transistors in a cascode configuration, in which an input transistor receives the first bias voltage and another transistor receives the second bias voltage. However, in such systems the drain to source voltage of the input transistor varies with temperature affecting the gain and reliability of the amplifier.

SUMMARY

It is an object of the disclosure to address one or more of the above-mentioned limitations. According to a first aspect of the disclosure, there is provided a bias generator for use with an electronic circuitry comprising a first switch coupled in series with a second switch; the bias generator being adapted to generate a reference voltage, a first bias voltage, and a second bias voltage; wherein the second bias voltage is based on the reference voltage; and wherein upon applying the first voltage to the first switch and the second voltage to the second switch, the bias generator controls a voltage across the first switch.

For example, the electronic circuit may be a signal amplifier circuit; an operational amplifier circuit or a voltage to current convertor circuit.

Optionally, the bias generator is adapted to set a value of the reference voltage to control the voltage across the first switch. For instance, the reference voltage may be set to a fix value so that the voltage across the first switch is maintained at a constant value.

Optionally, the reference voltage is temperature independent. For instance, the reference voltage may be a zero-temperature coefficient voltage.

Optionally, the voltage across the first switch is equal to the reference voltage.

Optionally, the bias generator comprises a first current source adapted to provide a first current, wherein the first current remains constant over temperature; a second current source adapted to provide a second current, wherein the second current varies over temperature; and a current mirror circuit coupled to the first current source and to the second current source.

For example, the second current may have a positive temperature coefficient or a negative temperature coefficient.

Optionally, the bias generator comprises a reference resistance coupled to the first current source to generate the reference voltage.

Optionally, the first current source is a zero-temperature coefficient current generator and the first current a zero-temperature coefficient current.

Optionally, the reference resistance is a zero-temperature coefficient resistance.

Optionally, the zero-temperature coefficient current generator comprises a first current source resistance and wherein the reference resistance is of a same type as the first current source resistance. For example, the first current source resistance and the reference resistance may be made of a same material.

Optionally, the second current source is a constant-transconductance current generator; and the second current comprises a first bias current and a second bias current; wherein the first bias current is equal to the second bias current.

Optionally, the current mirror circuit comprises a first current mirror coupled to a second current mirror in a cascode configuration; and wherein the reference resistance is coupled in parallel with the first current mirror.

Optionally, the first current mirror comprises a first mirror switch coupled to a second mirror switch; and wherein the second current mirror comprises a third mirror switch coupled to a fourth mirror switch.

Optionally, the first current source is coupled to the first mirror switch and to the third mirror switch.

Optionally, the first mirror switch has a same size as the second mirror switch; and wherein the third mirror switch has a same size as the fourth mirror switch; and wherein the first switch of the electronic circuit is N times the size of the first mirror switch, N being an integer equal or greater than one.

According to a second aspect of the disclosure there is provided a method of biasing a switch of an electronic circuit comprising a first switch coupled in series with a second switch; the method comprising generating a reference voltage; generating a first bias voltage; generating a second bias voltage based on the reference voltage; applying the first bias voltage to the first switch and the second bias voltage to the second switch to control a voltage across the first switch.

Optionally, the method comprises setting a value of the reference voltage to control the voltage across the first switch.

Optionally, the reference voltage is temperature independent.

Optionally, the voltage across the first switch is equal to the reference voltage.

Optionally, the voltage across the first switch is maintained at a constant value.

Optionally, the method comprises providing a first current source adapted to provide a first current wherein the first current remains constant over temperature; providing a second current source adapted to provide a second current, wherein the second current varies over temperature; and providing a current mirror circuit coupled to the first current source and to the second current source.

For example, the first current may be a zero-temperature coefficient current.

Optionally, the method comprises providing a reference resistance to generate the reference voltage.

The method according to the second aspect of the disclosure may share any of the features of the first aspect, as noted above and herein.

According to a third aspect of the disclosure there is provided a device comprising a bias generator according to the first aspect of the disclosure coupled to an electronic circuit comprising a first switch coupled to a second switch.

The device according to the third aspect of the disclosure may comprise any of the features described above in relation to the bias generator according to the first aspect of the disclosure.

BRIEF DESCRIPTION OF THE DRAWINGS

The disclosure is described in further detail below by way of example and with reference to the accompanying drawings, in which.

DESCRIPTION

Figure 1:
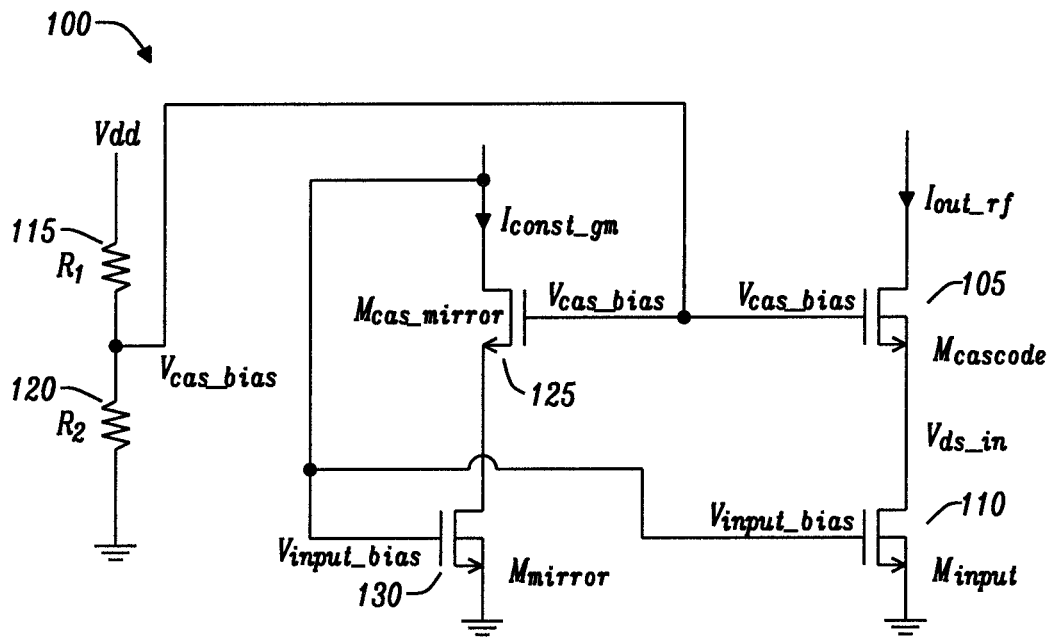
FIG. 1 is a diagram of a low noise amplifier provided with a common bias circuit.

FIG. 1 illustrates a conventional single ended low noise amplifier, LNA. The circuit 100 includes a first stage for providing a first bias voltage Vcas_bias; a second stage for providing a second bias voltage Vinput_bias; and a cascode amplifier connected to the first and second stages.

The cascode amplifier is formed by two transistors Mcascode 105 and Minput 110. The transistor Minput is used to receive a signal (not shown) to be amplified. The transistor Mcascode is used to increase the output impedance for gain enhancement.

The transistor Mcascode 105 has a gate terminal for receiving the first bias voltage Vcas_bias. The input transistor Minput 110 has a gate terminal for receiving the second bias voltage Vinput_bias and a source terminal connected to ground. The source terminal of transistor Mcascode 105 is connected to the drain terminal of the input transistor Minput 110.

The first stage consists of a voltage divider formed by resistances R1 115 and R2 120. The voltage divider has an input connected to a rail voltage Vdd and an output for providing the bias voltage Vcas_bias. The second stage includes two transistors Mcas_mirror 125 and Mmirror 130 connected in a cascode configuration.

The transistor Mcas_mirror 125 has a drain terminal for receiving a current Iconst_gm; a gate terminal for receiving the first bias voltage Vcas_bias. The transistor Mirror 130 has a gate terminal for receiving the second bias voltage Vinput_bias and a source terminal connected to ground. The source terminal of transistor Mcas_mirror 125 is connected to the drain terminal of the transistor Mmirror 130. The drain of transistor Mcas_mirror 125 is connected to the gate of transistor Mmirror 130.

In operation, the second stage provides the bias voltage Vinput_bias at the gate terminal of transistor Minput 110 and the first stage provides the cascode bias voltage Vcas_bias at the gate terminal of transistor Mcascode 105. The voltage Vcas_bias varies with temperature. The transistors Mmirror 130 and Minput 110 have a same gate-to-source voltage, but different drain-to-source voltages. The drain-to-source voltage of transistor Minput 110 varies with temperature. This results in variations of the transconductance of transistor Minput; which limits the use of the amplifier.

Figure 2:
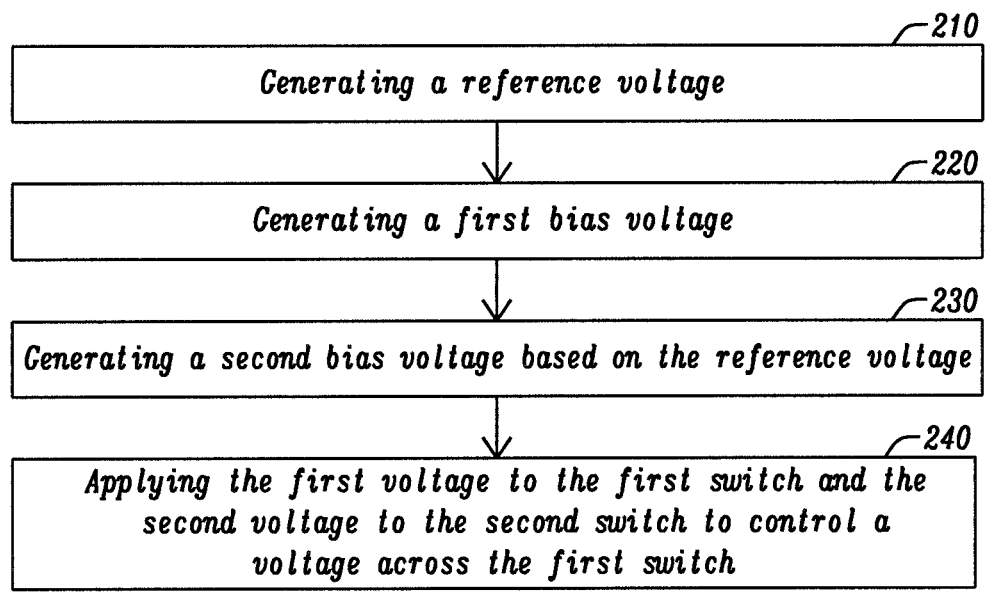
FIG. 2 is a flow chart of a method for generating a bias.

FIG. 2 illustrates a method for biasing a switch of an electronic circuit comprising a first switch coupled in series with a second switch. For example, the electronic circuit may be a signal amplifier, an operational amplifier or a voltage to current convertor. Such circuits would include a first switch, also referred to as input switch coupled in series with a second switch.

At step 210 a reference voltage is generated. For instance, the reference voltage may be temperature-independent such as a zero-temperature coefficient voltage. At step 220 a first bias voltage is generated. At step 230 a second bias voltage based on the reference voltage is generated. At step 240 the first voltage is applied to the first switch and the second voltage is applied to the second switch to control a voltage across the first switch.

For instance, the reference voltage may be maintained at a constant value to keep the value of the voltage across the first switch constant. If the first switch is a field-effect transistor (FET), the voltage across the first switch may be a voltage between the drain terminal and the source terminal of the FET transistor. If the first switch is a bipolar junction transistor (BJT), the voltage across the first switch may be a voltage between the collector terminal and the emitter terminal of the BJT transistor. This approach permits the generation of stable bias voltages allowing to maintain constant transconductance and gain over temperature and process variations.

Figure 3:
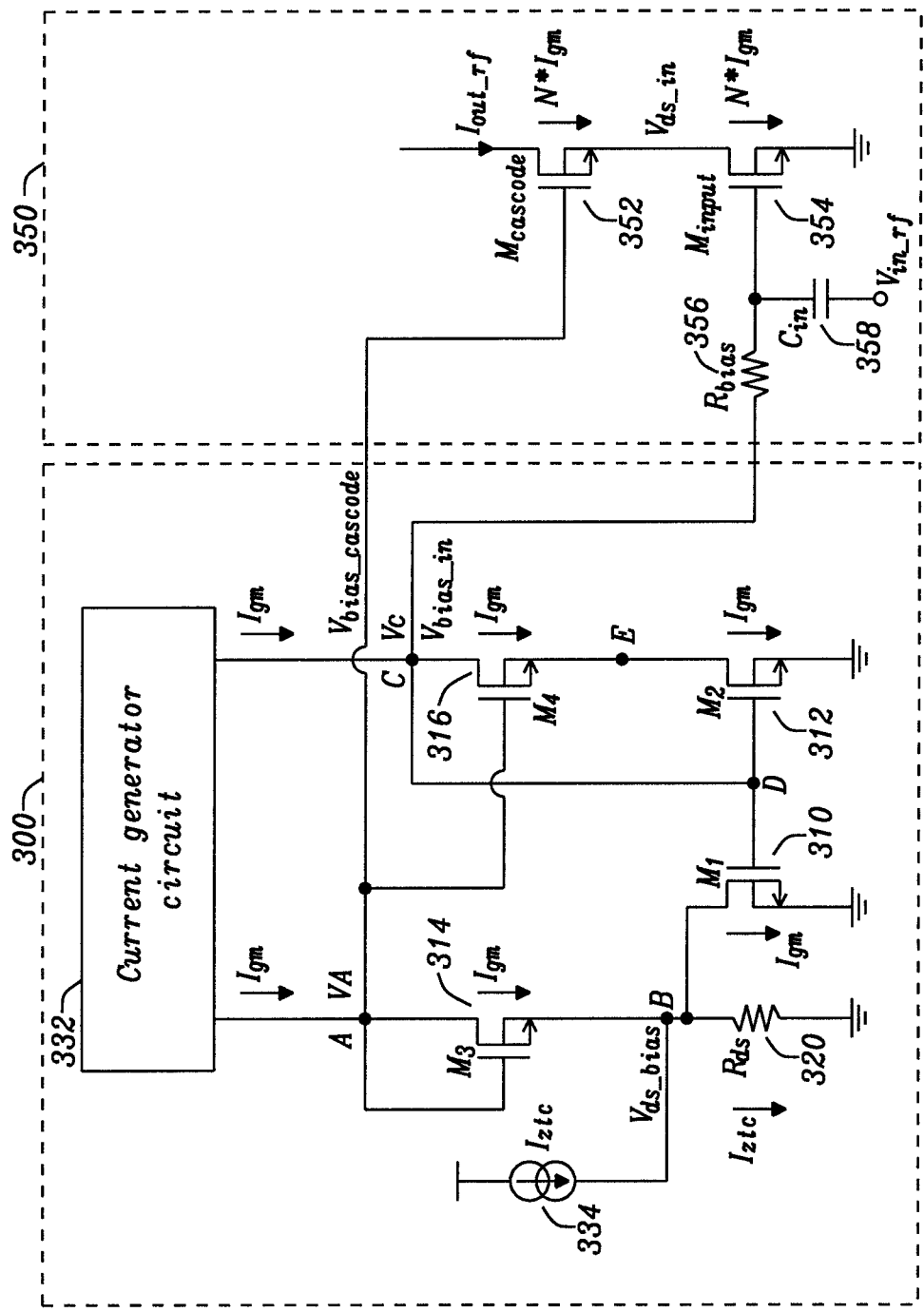
FIG. 3 is a diagram of a circuit for implementing the method of FIG. 2.

FIG. 3 illustrates a bias generator 300 coupled to an electronic circuit or input stage 350. The bias generator 300 includes a first current mirror formed by first switch M1 310 and second switch M2 312; a second current mirror formed by third switch M3 314 and fourth switch M4 316; a resistor Rds 320 and two current generators or current sources 332 and 334. The first and second current mirrors are arranged in a cascode configuration.

The first current source 332 may be a constant-transconductance current generator circuit for providing a bias current referred to as constant-transconductance current Igm. Such circuits are well known in the art and may include a resistance Rgm such that the transconductance Gm is proportional to 1/Rgm.

The second current source 334 may be a temperature-independent current source for providing a current which remains substantially constant over temperature. The second current source 334 may be provided by a zero-temperature-coefficient ZTC current generator, or by a bandgap reference.

The switches may be embodied as transistors, such as metal oxide semiconductor field-effect transistors MOSFETs or bipolar junction transistors BJTs. Each transistor has three terminals, a first terminal also referred to as control terminal, and another two terminals. In the case of a FET transistor the control terminal is a gate terminal; the second terminal a source terminal; and the third terminal a drain terminal.

In the present example the transistors M1, M2, M3 and M4 are provided by N types MOSFETs. The third switch M3 has a drain terminal coupled to the first current source 332 at node A for receiving a bias current Igm. The switch M3 has a source terminal coupled to a resistance Rds 320 at node B; and a gate terminal coupled to M3 drain terminal at node A. The second current source 334 is coupled to the third switch M3 314 and to the resistance Rds 320 at node B. The first switch M1 310 is coupled in parallel to the resistance Rds 320. The first switch has a drain terminal coupled to node B and a source terminal coupled to ground. The resistance Rds may be chosen to have a low temperature coefficient. The temperature coefficient of resistance refers to the resistance change per degree of temperature variation.

The fourth switch M4 has a drain terminal coupled to the first current source 332 at node C for receiving a bias current Igm. The switch M4 has a source terminal coupled to a drain terminal of the second switch M2 312 at node E; and a gate terminal coupled to node A. The second switch M2 312 has a gate terminal coupled to the gate terminal of switch M1 310 at node D. The drain terminal of switch M4 316 is coupled to the gate terminals of switches M1 and M2 at node D. The bias generator circuit 300 has a first output at node A for providing a first voltage VA; and a second output at node C for providing a second voltage VC.

The input stage 350 is formed by switches Mcascode 352 and Minput 354 arranged in a cascode configuration. In the present example the switches 352 and 354 are embodied by MOSFETs transistors. The transistor Mcascode 352 has a drain terminal for receiving a current Iout_rf, and a gate terminal for receiving the first voltage, bias voltage Vcas_bias from the bias generator 300. The input transistor Minput 354 has a gate terminal for receiving the second bias voltage, Vinput_bias, from the bias generator 300; and a source terminal connected to ground. The source terminal of transistor Mcascode 352 is connected to the drain terminal of the input transistor Minput 354. Optionally, an RC filter formed by resistor Rbis 356 and capacitor 358 may be provided at the gate terminal of the input transistor 354. The RC filter is used to pass an RF input signal without affecting the DC bias voltage on the input transistor 354.

The switch Minput 354 is mirrored to switches M1 310 and M2 312. Similarly, the switch Mcascode 352 is mirrored to switches M3 314 and M4 316. Typically, the switches Minput 354 and Mcascode 352 have the same size. The switches M1 and M2 may have the same size, such that the size ratio M1/M2=1. Similarly, the switches M3 and M4 may have the same size, such that the size ratio M3/M4=1. The switch Minput 354 may be N times the size of the switches M1 or M2, in which N is an integer. Similarly, the switch Mcascode 352 may be N times the size of the switches M3 or M4.

It will be appreciated that the topology of circuit 300 could be implemented using P types MOSFETS. In this case the polarity of the transistors M1, M2, M3 and M4 would be reversed.

In operation, the signal amplifier 350 works as a RF voltage to RF current converter. An input RF signal $V_{in_{rf}}$ to be amplified drives the gate of transistor Minput 354. The output current Iout_rf has an AC and a DC component derived as:

$$I_{out_{rf}} = I_{out_{dc}} + Gm \cdot V_{in_{rf}}$$

$$I_{out_{dc}} = N \cdot I_{Gm}$$

In which N is the size ratio of the transistor Minput 354 over the transistor M2 312; and Gm is the transconductance of Minput.

The function of the capacitor Cin 358 is to pass the high frequency RF signal and to isolate the DC voltage (for instance from an antenna). On the other hand, the resistance Rbias 356 and the capacitor Cin 358 form a low pass filter for the bias voltage Vbias_in.

The bias generator 300 operates to control the drain to source voltage Vds_in of the input transistor 354, so as to maintain the transconductance Gm of Minput constant. The first current source 332, also referred to as constant-Gm current generator circuit provides a first bias current I1; and a second bias current I2 equal to I1, such that I1=I2=Igm referred to as constant-transconductance current. The constant-transconductance current Igm remains constant at constant temperature but varies as the temperatures changes such that the transconductance Gm of the switch Minput 354 remains constant, assuming a constant voltage Vds_in. In the present example Minput is a MOSFET transistor and the current Igm has a positive temperature coefficient. The current Igm through M3 is mirrored to M4. Similarly, Igm through M2 is mirrored to M1.

The second current generator 334 provides a current Iztc. Since the current flowing through M1 is Igm, the current flowing through Rds is Iztc. As a result, the voltage V_Rds through the resistance Rds 320 can be expressed as:

$$V_{Rds} = I_{ZTC} \cdot R_{ds} = V_{ds_{bias}}$$

$$I_{Rds} = I_{ZTC}$$

As described above, the resistance Rds has a low temperature coefficient. As a result, the voltage Vds_bias remains substantially constant over temperature. The voltage $V_{ds_{bias}}$ only depends of the resistance Rds and the current Iztc and may be kept at a fixed value, for example 200 mV.

If the size of transistor Minput is N times the size of transistor M2, in which N is an integer equal or greater than one, then:

$$I_{out_{rf}} = N \cdot I_{gm}$$

$$Gm(Minput) = N \cdot Gm(M_2)$$

As described above the current Igm through M3 is the same as the current through M4. Therefore, the transistors M3 and M4 have the same source voltage. Therefore, the voltage $V_{ds_{bias}}$ at node B equal the voltage at node E with respect to ground.

$$Vgs(M4) = Vgs(M3) = V_A - V_B$$

As a result, the drain to source voltage of the voltage of transistor Minput 354 equals Vds_bias.

$$V_{ds_{bias}} = V_{ds_{in}}$$

The voltage VA is based on $V_{Rds}$ and may be expressed as $$V_A = I_{ZTC} \cdot R_{Rds} + V_{gs}(M_3)$$

The voltage $V_{ds_{bias}}$ only depends of the resistance Rds and the current Iztc and may be kept at a fixed value, for example 200 mV. If Vds-bias is kept at a fixed value, the drain-to-source voltage of the input transistor Minput 354 is controlled to be constant over temperature. As a result, the transconductance of the switch 354 remains constant over temperature. In turn the gain of the amplifier 350 remains constant over temperature. The voltage Vds_bias may be programable to suit different applications and circuit requirements. This may be achieved by changing the current Iztc.

The circuit 300 is advantageous as it eliminates current variations across the switch Minput 354 due to Vds modulation effect; while requiring relatively few components.

Figure 4:
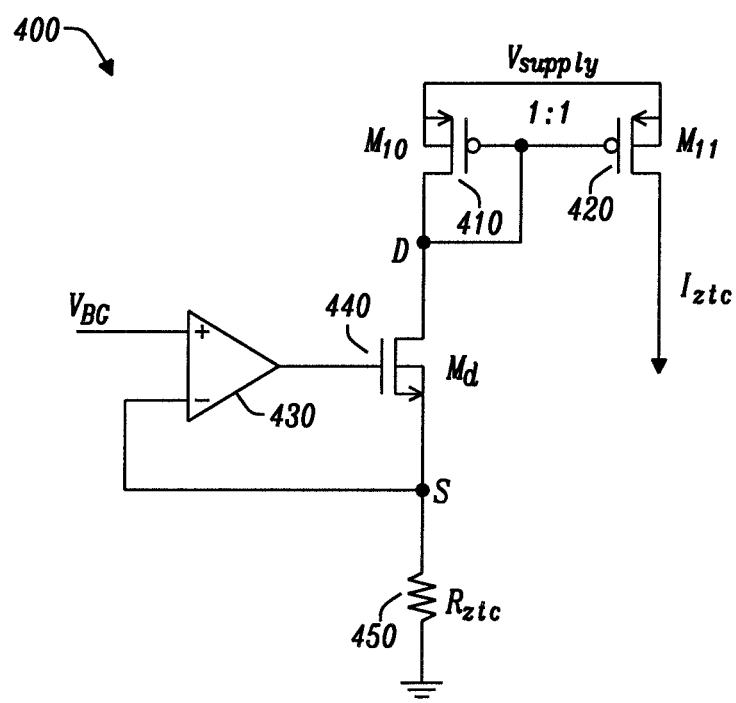
FIG. 4 is a diagram of a zero-temperature-coefficient current generator.

FIG. 4 illustrates an example of a temperature-independent current source. The circuit 400 is a zero temperature-coefficient current generator. The circuit includes a current mirror formed by transistor M10 410 and M11 420. The current mirror is coupled to a comparator 430 via a third transistor Md 440. The third transistor is coupled to ground via a zero-temperature coefficient resistance Rztc 450.

The transistors 410 and 420 have a source terminal coupled to a voltage Vsupply. Transistor 420 has a gate terminal coupled to the gate terminal of transistor 410 and a drain terminal coupled to and output of the circuit. The drain terminal of transistor 410 is coupled its gate terminal and to the drain terminal of transistor Md 440 at node D.

The comparator 430 has a first input, for example a non-inverting input coupled to a reference voltage $V_{BG}$; a second input, for example an inverting input coupled to the source terminal of transistor Md 440 at node S; and an output coupled to the gate of transistor Md 440. The voltage $V_{BG}$, is a band gap voltage with a zero-temperature-coefficient.

In operation, the comparator 430 compares a voltage VS across the resistance Rztc 450 with a reference voltage $V_{BG}$ to control the transistor Md 440. When $V_S=V_{BG}$, the comparator 430 provides a signal to turn on the transistor 440. A current Iztc flows through the transistor Md 440 such that $$I_{ZTC} = \frac{V_{BG}}{R_{ZTC}}$$

The current $I_{ZTC}$ flows through transistor M10 410 and is mirrored through transistor M11 420.

Referring to FIG. 3, by choosing the resistance Rds 320 to be of the same type as resistance Rztc 450, the temperature independence of Vds_bias can be further improved. Resistances are of the same type if they are made of a same material; hence having the same of temperature coefficient. However, the resistances may or may not have the same resistance value. For example, the resistances Rds and Rztc, may be made of a same type of polysilicon. The resistances 320 and 450 do not necessarily need to be ZTC resistances if they are of a same type.

Figure 5:
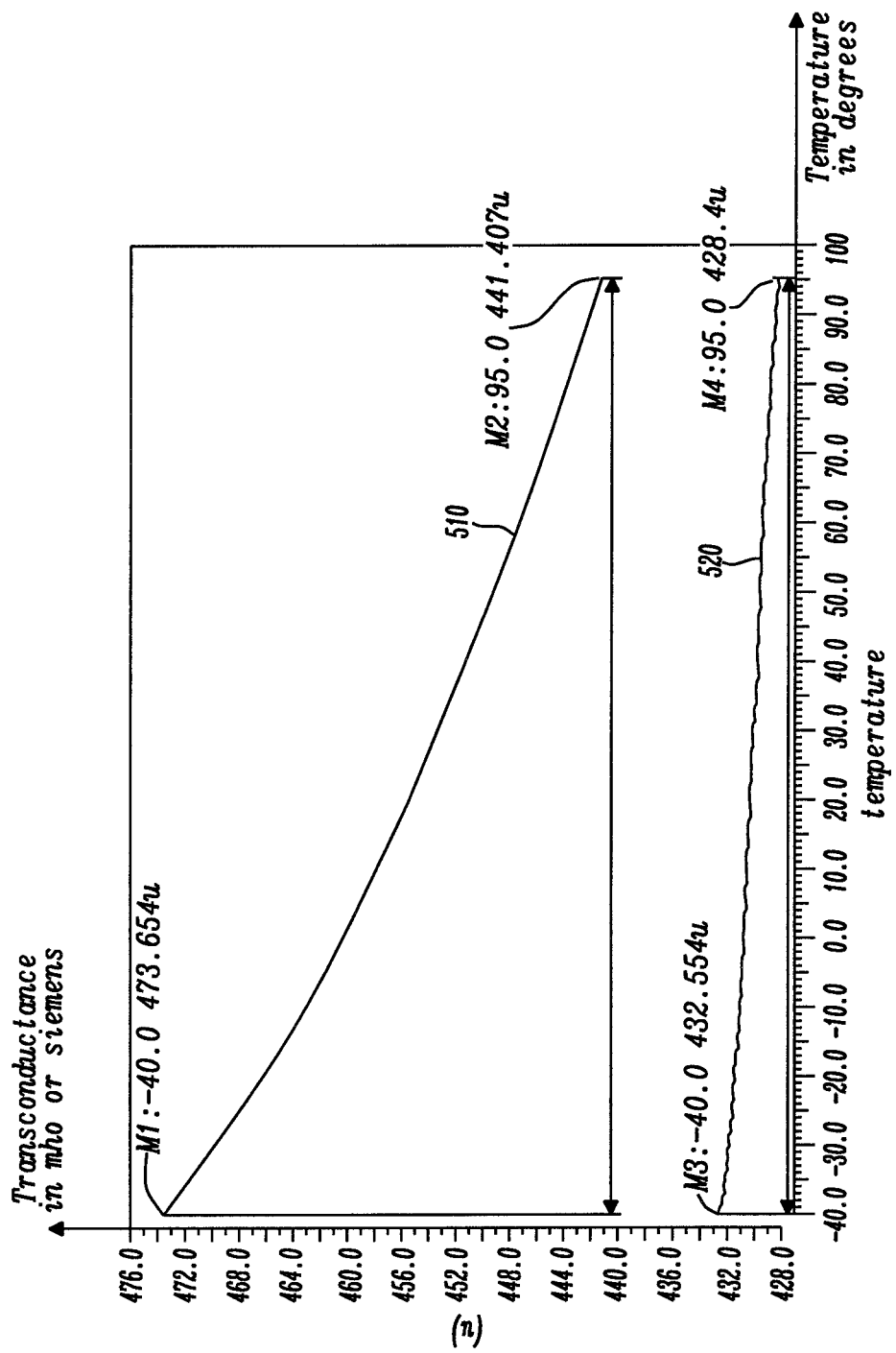
FIG. 5 is a simulation of the transconductance as a function of temperature obtained for the switch Minput of FIG. 1 and FIG. 3 respectively.

FIG. 5 is a simulation of the transconductance as a function of temperature obtained for the switch Minput 110 of FIG. 1 (curve 510); and the switch Minput 354 respectively (curve 520).

The top curve 510 shows a Gm variation of about 8% over a temperature difference of 140 degrees, while the bottom curve 520 shows a Gm variation of about 1% over the same temperature difference.

A skilled person will appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A bias generator for use with an electronic circuity comprising a first switch coupled in series with a second switch; the bias generator being adapted to generate a reference voltage, a first bias voltage, and a second bias voltage;
   wherein the second bias voltage is based on the reference voltage; and
   wherein upon applying the first voltage to the first switch and the second voltage to the second switch, the bias generator controls a voltage across the first switch;
   wherein the bias generator comprises a first current source adapted to provide a first current, wherein the first current remains constant over temperature;
   a second current source adapted to provide a second current;
   a reference resistor coupled to the first current source to generate the reference voltage; and
   a current mirror circuit coupled to the first current source and to the second current source, the current mirror circuit comprising a first current mirror coupled to a second current mirror in a cascode configuration.

2. The bias generator as claimed in claim 1, wherein the bias generator is adapted to set a value of the reference voltage to control the voltage across the first switch.

3. The bias generator as claimed in claim 1, wherein the reference voltage is temperature independent.

4. The bias generator as claimed in claim 1, wherein the voltage across the first switch is equal to the reference voltage.

5. The bias generator as claimed in claim 1,
   wherein the second current varies over temperature.

6. The bias generator as claimed in claim 1, wherein the first current source is a zero-temperature coefficient current generator and the first current a zero-temperature coefficient current.

7. The bias generator as claimed in claim 1, wherein the reference resistor has a zero-temperature coefficient resistance.

8. The bias generator as claimed in claim 6, wherein the zero-temperature coefficient current generator comprising a first current source resistance and wherein the reference resistance is of a same type as the first current source resistance.

9. The bias generator as claimed in claim 1, wherein the second current source is a constant-transconductance current generator; and wherein the second current comprises a first bias current and a second bias current; wherein the first bias current is equal to the second bias current.

10. The bias generator as claimed in claim 1, wherein the reference resistor is coupled in parallel with the first current mirror.

11. The bias generator as claimed in claim 1, wherein the first current mirror comprises a first mirror switch coupled to a second mirror switch; and wherein the second current mirror comprises a third mirror switch coupled to a fourth mirror switch.

12. The bias generator as claimed in claim 11, wherein the first current source is coupled to the first mirror switch and to the third mirror switch.

13. The bias generator as claimed in claim 11, wherein the first mirror switch has a same size as the second mirror switch; and wherein the third mirror switch has a same size as the fourth mirror switch; and wherein the first switch of the electronic circuit is N times the size of the first mirror switch, N being an integer equal or greater than one.

14. A method of biasing a switch of an electronic circuit comprising a first switch coupled in series with a second switch; the method comprising the steps of:
   generating a reference voltage;
   generating a first bias voltage;
   generating a second bias voltage based on the reference voltage;
   applying the first bias voltage to the first switch and the second bias voltage to the second switch to control a voltage across the first switch;
   providing a first current source adapted to provide a first current, wherein the first current remains constant over temperature;
  providing a second current source adapted to provide a second current;
  providing a reference resistor coupled to the first current source to generate the reference voltage;
  providing a current mirror circuit coupled to the first current source and to the second current source, the current mirror circuit comprising a first current mirror coupled to a second current mirror in a cascode configuration.

15. The method as claimed in claim 14, comprising the step of:
  setting a value of the reference voltage to control the voltage across the first switch.

16. The method as claimed in claim 14, wherein the reference voltage is temperature independent.

17. The method as claimed in claim 14, wherein the voltage across the first switch is equal to the reference voltage.

18. The method as claimed in claim 14, wherein the voltage across the first switch is maintained at a constant value.

19. The method as claimed in claim 14 wherein the second current varies over temperature.

20. A device comprising a bias generator as claimed in claim 1 coupled to an electronic circuit comprising a first switch coupled to a second switch.

* * * * *